United States Patent
Bu et al.

(10) Patent No.: US 10,408,596 B2
(45) Date of Patent: Sep. 10, 2019

(54) APPARATUS FOR DETECTING DISTANCE BETWEEN CARRIER AND PLATE

(71) Applicant: BOE TECHNOLOGY GROUP CO., LTD., Beijing (CN)

(72) Inventors: Bin Bu, Beijing (CN); Changqi Hu, Beijing (CN); Shupeng Guo, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 84 days.

(21) Appl. No.: 15/580,213

(22) PCT Filed: Apr. 1, 2017

(86) PCT No.: PCT/CN2017/079229
§ 371 (c)(1),
(2) Date: Dec. 6, 2017

(87) PCT Pub. No.: WO2017/211111
PCT Pub. Date: Dec. 14, 2017

(65) Prior Publication Data
US 2019/0033051 A1    Jan. 31, 2019

(30) Foreign Application Priority Data
Jun. 6, 2016  (CN) .................... 2016 2 0541268 U

(51) Int. Cl.
G01B 5/14      (2006.01)
G01B 21/16     (2006.01)
C23C 14/24     (2006.01)

(52) U.S. Cl.
CPC ............... G01B 5/14 (2013.01); C23C 14/24 (2013.01); G01B 21/16 (2013.01)

(58) Field of Classification Search
CPC ..................................................... G01B 5/14
(Continued)

(56) References Cited

U.S. PATENT DOCUMENTS 5,163,228 A * 11/1992 Edwards ................ A61B 5/107
33/1 N
5,218,769 A *  6/1993 Tranchon ............. G01D 5/3473
33/1 N
(Continued)

FOREIGN PATENT DOCUMENTS

CN        204286319 U      4/2015
CN        104776782 A      7/2015
(Continued)

OTHER PUBLICATIONS

International Search Report and Written Opinion for PCT/CN2017/079229, dated Jun. 30, 2017.

*Primary Examiner* — George B Bennett
(74) *Attorney, Agent, or Firm* — Foley & Lardner LLP; James F. Ewing; Paul M. H. Pua

(57) ABSTRACT

The present disclosure relates to an apparatus for detecting a distance between a carrier and a plate, the apparatus comprising: a base provided on the carrier; a rotation mechanism rotatably provided on the base and configured to rotate when the carrier is in contact with the plate during movement of the carrier relative to the plate; a rotation angle measuring mechanism configured to measure a rotation angle of the rotation mechanism so as to obtain the distance according to the rotation angle. The distance between the carrier and the plate can be calculated based on the rotation angle of the rotation mechanism, so that accurate measurement of the distance between the carrier and the plate can be realized. Further, the operation performance of the gap detection apparatus would not be affected or damaged by the vacuum environment.

11 Claims, 3 Drawing Sheets

(58) Field of Classification Search
USPC .................................. 33/1 PT, 706, 707, 708
See application file for complete search history.

(56) References Cited

U.S. PATENT DOCUMENTS

| | | | | |
|---|---|---|---|---|
| 5,594,434 | A | * | 1/1997 | McCullough ...... G01D 5/24404 250/231.13 |
| 5,855,072 | A | * | 1/1999 | Nakaho ................ B62D 15/022 33/1 N |
| 6,093,928 | A | * | 7/2000 | Ohtomo .................. G01D 5/34 250/231.13 |
| RE42,082 | E | * | 2/2011 | Raab ...................... B25J 18/002 33/1 N |
| 2005/0217126 | A1 | * | 10/2005 | Inoue ....................... G01D 5/04 33/1 PT |
| 2010/0011603 | A1 | * | 1/2010 | Finkler ................ G01D 5/2455 33/706 |
| 2013/0151194 | A1 | * | 6/2013 | Hawken ................ F02D 41/009 702/151 |
| 2014/0290084 | A1 | * | 10/2014 | Revach .................. G01B 21/02 33/701 |
| 2015/0033566 | A1 | * | 2/2015 | Chen ........................ G01D 5/06 33/1 PT |

FOREIGN PATENT DOCUMENTS

| | | | |
|---|---|---|---|
| CN | 105043216 | A | 11/2015 |
| CN | 205664807 | U | 10/2016 |
| JP | 2003260377 | A | 9/2003 |
| JP | 2009244004 | A | 10/2009 |

\* cited by examiner

APPARATUS FOR DETECTING DISTANCE BETWEEN CARRIER AND PLATE

CROSS REFERENCE TO RELATED APPLICATIONS

The present application is a U.S. National Stage under 35 U.S.C. § 371 of International Application No. PCT/CN2017/079229, filed on Apr. 1, 2017, which claims priority to and the benefit of Chinese Application No. 201620541268.0 filed on Jun. 6, 2016 and entitled "APPARATUS FOR DETECTING DISTANCE BETWEEN CARRIER AND PLATE", the disclosure of which is hereby incorporated by reference in its entirety.

FIELD OF THE INVENTION

Embodiments of the present disclosure relate to the technical field of vapor deposition, and particularly to an apparatus for detecting a distance between a carrier and a plate.

BACKGROUND

In the preparation of Organic Light Emitting Devices (OLEDs), metal cathodes must be prepared in a vacuum vapor deposition device.

Current vapor deposition devices cannot detect a distance between a carrier and a shielding plate in a vacuum environment. Interference detection is performed for a carrier in a vacuum chamber with respect to a delivery mechanism through practical delivery of the carrier, in which it is difficult to determine a precise distance and there is a risk of interference, thereby it is difficult to guarantee delivery safety.

SUMMARY

I. Technical Problem to be Solved

The present disclosure provides an apparatus for detecting a distance between a carrier and a plate, so as to solve the problem that current vapor deposition devices cannot detect a distance between a carrier and a shielding plate in a vacuum environment, which may cause a risk of interference.

II. Technical Solution

In order to solve the above technical problem, the present disclosure provides an apparatus for detecting a distance between a carrier and a plate, the apparatus comprising: a base provided on the carrier; a rotation mechanism rotatably provided on the base and configured to rotate when the carrier is in contact with the plate during movement of the carrier relative to the plate; a rotation angle measuring mechanism configured to measure a rotation angle of the rotation mechanism so as to obtain the distance according to the rotation angle.

According to an exemplary embodiment of the present disclosure, the rotation mechanism may comprise a rotation shaft rotatably provided on the base, and a rotation arm for coming into contact with the plate and driving the rotation shaft to rotate, one end of the rotation arm being connected to the rotation shaft and the other end of the rotation arm pointing to a direction away from the base.

According to the exemplary embodiment of the present disclosure, the rotation angle measuring mechanism comprises a rotation ring disposed around the rotation shaft and capable of rotating in a single direction driven by rotation of the rotation shaft, wherein a third scale mark is provided on the base at a position corresponding to the circumference of the rotation ring.

According to an exemplary embodiment of the present disclosure, a notch groove is provided along the circumferential direction of the rotation ring, wherein the rotation shaft is provided with a toggle pin which is slidably inserted into the notch groove.

According to an exemplary embodiment of the present disclosure, the apparatus for detecting a distance between a carrier and a plate further comprises a reset spring, wherein one end of the reset spring is connected to the base and the other end of the reset spring is connected to the rotation shaft, wherein the reset spring is used to put the rotation arm to its initial position when the rotation arm is not in contact with the plate.

According to an exemplary embodiment of the present disclosure, a stopper is provided on the base and a limiter is provided on the rotation shaft, wherein when the rotation arm is at its initial position, the limiter abuts against the stopper.

According to an exemplary embodiment of the present disclosure, the rotation mechanism further comprises a first turntable for coming into contact with the plate and producing rotation; and a second turntable for measuring a number of rotations of the first turntable, wherein the first turntable is provided at one end of the rotation arm away from the base, a first scale mark is provided on a circumference of the first turntable, and a protrusion is provided at the zero position of the first scale mark; the second turntable is provided with gear teeth and a second scale mark corresponding to the gear teeth; wherein the protrusion can mate with the gear teeth.

According to an exemplary embodiment of the present disclosure, the rotation arm is provided with a fixed shaft perpendicular to the rotation arm at one end away from the base, wherein the first turntable is rotatably disposed around the fixed shaft.

According to an exemplary embodiment of the present disclosure, the rotation arm is provided with a post perpendicular to the rotation arm, and a support shaft parallel to the rotation arm is provided on one side of the post opposite to the base, the second turntable is rotatably disposed around the support shaft and located above the side edge of the first turntable.

According to an exemplary embodiment of the present disclosure, the third scale mark has a series of values of distance between the carrier and the plate that correspond to the rotation angles of the rotation mechanism.

According to an exemplary embodiment of the present disclosure, the apparatus for detecting a distance between a carrier and a plate is located in a chamber for vacuum vapor deposition, and the plate is a shielding plate.

Advantageous Effect

The above technical solutions of the present disclosure have the following advantages.

The distance between the carrier and the plate can be calculated based on the rotation angle of the rotation mechanism, so that accurate measurement of the distance between the carrier and the plate can be realized. Further, the performance of the distance detection apparatus would not be affected or damaged by the vacuum environment. As a result, the distance between the carrier and the plate can be measured in a vacuum chamber of a vacuum vapor deposition device, thereby reducing a risk of interference between the carrier and the plate and guaranteeing delivery safety.

DETAILED DESCRIPTION OF PREFERRED EMBODIMENTS

In order to make objectives, technical schemes and advantages of the present disclosure more clear, a clear and complete description will be made for the technical solution of the embodiments of this disclosure with reference to the figures. As it will be apparent, merely some embodiments of this disclosure, rather than all embodiments thereof, are described herein. All other embodiments obtained by those skilled in the art based on the embodiments of the present disclosure without creative efforts shall fall within the protection scope of the present disclosure.

Figure 1:
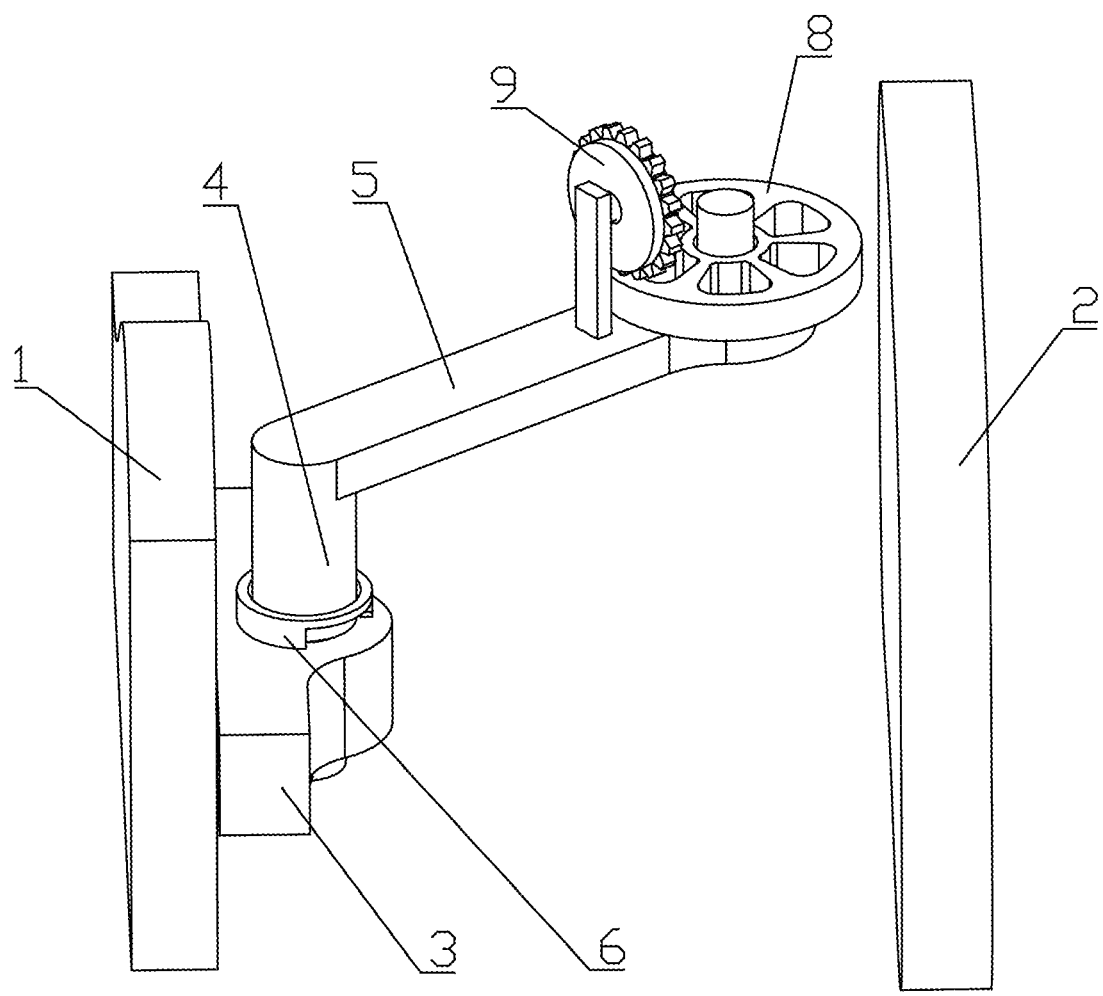
FIG. 1 is a schematic view of an apparatus in use for detecting a distance between a carrier and a plate according to an embodiment of the present disclosure.
Figure 2:
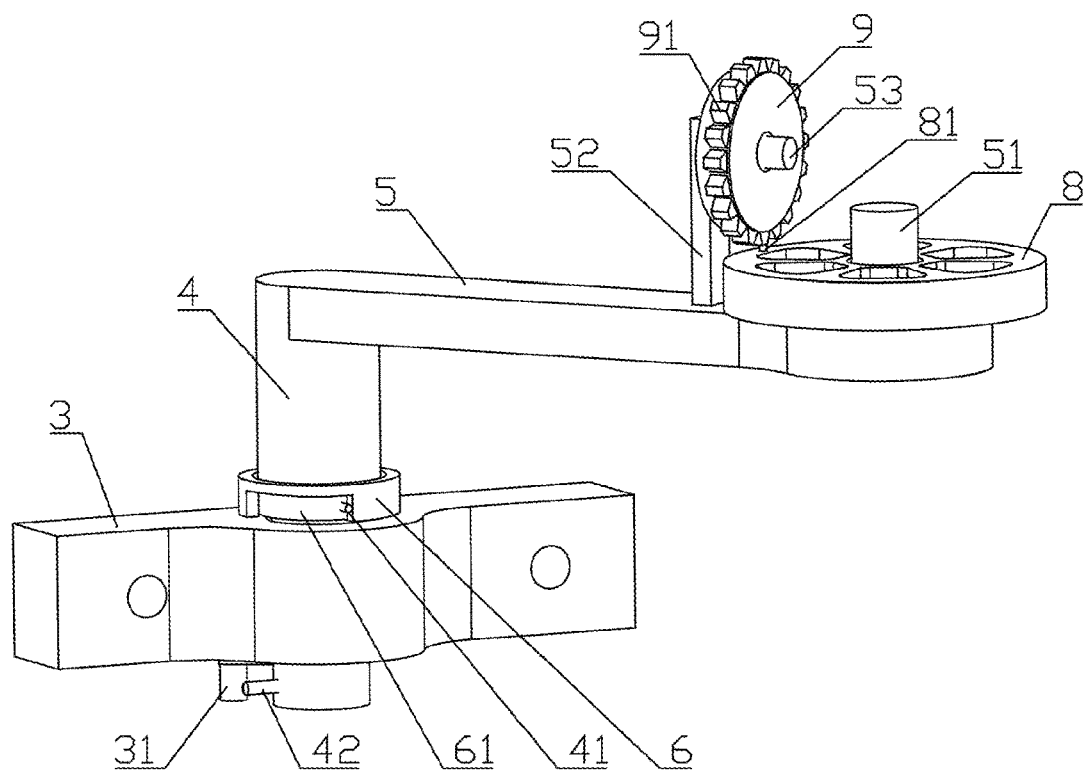
FIG. 2 is a schematic view of the structure of the apparatus for detecting a distance between a carrier and a plate according to the embodiment of the present disclosure.
Figure 3:
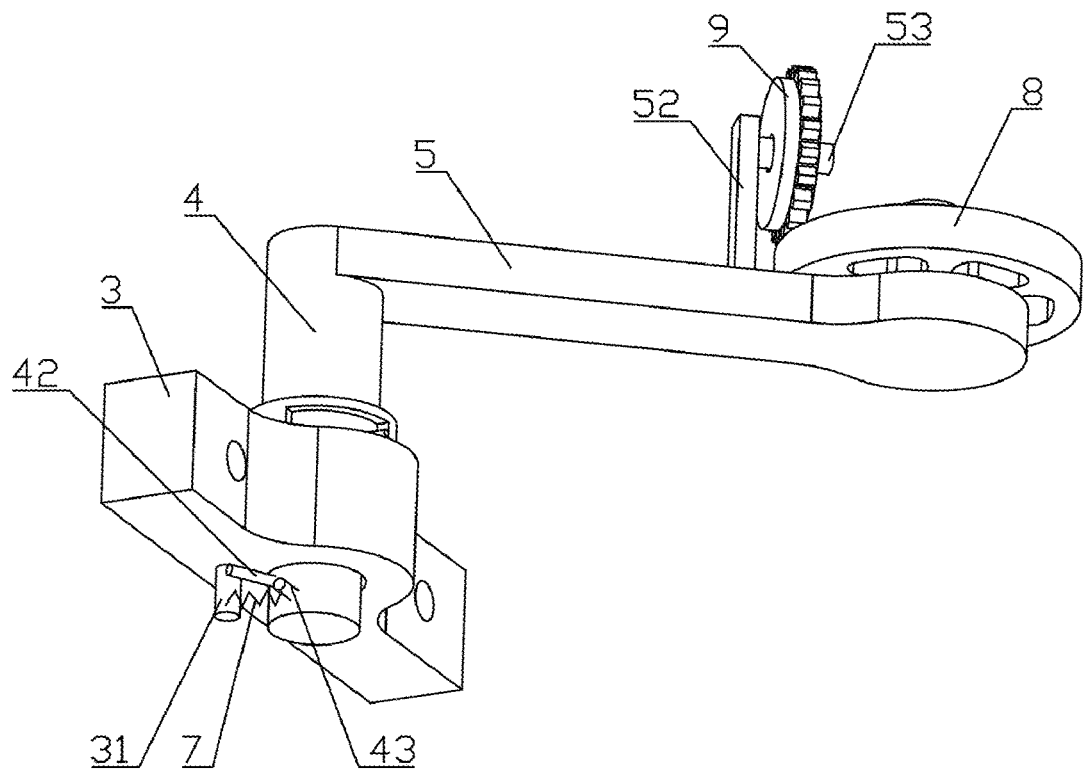
FIG. 3 is a bottom view of the apparatus for detecting a distance between a carrier and a plate according to the embodiment of the present disclosure.

FIGS. 1 to 3 show an exemplary embodiment of an apparatus of the present disclosure for detecting a distance between a carrier and a plate. As shown in FIG. 1, according to an exemplary embodiment of the present disclosure, an apparatus for detecting a distance between a carrier and a plate is provided on a carrier 1, wherein the apparatus is used to detect a distance between the carrier 1 and the plate 2 when the carrier 1 moves relatively to the plate 2. The plate 2 may be a shielding plate or any other mechanism located around the carrier 1.

In an exemplary embodiment of the present disclosure, the apparatus for detecting a distance between a carrier and a plate may be located in a chamber for vacuum vapor deposition, and the plate may be a shielding plate. In other exemplary embodiments of the present disclosure, the apparatus for detecting a distance between a carrier and a plate may be also located in another vacuum or non-vacuum chamber, and the plate may be other mechanisms that can interfere with the carrier.

As shown in FIG. 1, according to an exemplary embodiment of the present disclosure, the apparatus for detecting a distance between a carrier and a plate comprises a base 3, a rotation mechanism, and a rotation angle measuring mechanism, wherein the base 3 is fixedly provided on the carrier 1 and the rotation mechanism can be rotatably provided on the base 3. During movement of the carrier 1 relative to the plate 2, if the actual distance between the carrier 1 and the plate 2 is greater than a predetermined distance, the rotation mechanism does not come into contact with the plate 2, in which case the rotation mechanism is at an initial position. If the actual distance between the carrier 1 and the plate 2 is less than the predetermined distance, the rotation mechanism can come into contact with the plate 2 and rotate, thereby departing from its initial position. A rotation angle of the rotation mechanism can be measured by the rotation angle measuring mechanism, so that the distance between the carrier 1 and the plate 2 can be obtained according to the rotation angle.

In the apparatus for detecting a distance between a carrier and a plate according to an exemplary embodiment of the present disclosure, the distance between the carrier 1 and the plate 2 can be calculated based on the rotation angle of the rotation mechanism, so that accurate measurement of the distance between the carrier 1 and the plate 2 can be realized. Further, because the apparatus for detecting a distance between a carrier and a plate is a mechanical structure, which does not comprise a gap sensor that requires power supply, its operation performance would not be affected or damaged by the vacuum environment. Therefore, the apparatus is particularly suitable for measuring the distance between the carrier 1 and a shielding plate or other mechanism located around the carrier 1 in a vacuum chamber of a vacuum vapor deposition device, so as to reduce a risk of interference between the carrier 1 and the shielding plate or other mechanism and guarantee delivery safety.

Optionally, in an exemplary embodiment of the present disclosure, as shown in FIG. 2, the rotation mechanism comprises a rotation shaft 4 and a rotation arm 5. There is a through hole on the base 3. The rotation shaft 4 is rotatably inserted in the through hole on the base 3. One end of the rotation arm 5 is fixedly connected to the rotation shaft 4. The other end of the rotation arm 5 points to a direction away from the base 3. When the actual distance between the carrier 1 and the plate 2 is greater than a predetermined distance, the rotation arm 5 is at its initial position, where, for example, an angle such as an acute angle is formed between the rotation arm 5 and a surface of the carrier 1 facing the rotation arm 5. When the actual distance between the carrier 1 and the plate 2 is less than the predetermined distance, the end of the rotation arm 5 away from the base 3 comes into contact with the plate 2 and starts to rotate, as a result, the rotation shaft 4 is driven to rotate.

Optionally, as shown in FIG. 2, the rotation angle measuring mechanism comprises a rotation ring 6. According to an exemplary embodiment of the present disclosure, the rotation ring 6 is disposed on the base 3 and is disposed around the rotation shaft 4. The rotation ring 6 can rotate in a single direction when driven by the rotation of the rotation shaft 4, and finally stop at a maximum rotation angle of the rotation shaft 4. A third scale mark (not shown) is provided at a position on the base 3 corresponding to the circumference of the rotation ring 6. The angle at which the rotation ring 6 finally stops, i.e., the maximum value of the rotation angle of the rotation shaft 4, can be read out from the third scale mark. Thereby, measurement of the rotation angle of the rotation shaft 4 can be realized.

In some exemplary embodiments of the present disclosure, the third scale mark has a series of angle values corresponding to the rotation angles of the rotation shaft 4. Based on these angle values, a distance between the carrier 1 and the plate 2 interfered with each other can be calculated according to a simple geometric relationship. This calculation can be, for example, performed manually.

In some exemplary embodiments of the present disclosure, the third scale mark directly provides a series of values of distance between the carrier 1 and the plate 2 corresponding to the rotation angles of the rotation shaft 4 (i.e., the rotation angles of the rotation mechanism, or the rotation angles of the rotation arm 5) (the distance values can be calculated and marked on the scale mark in advance). In this way, a minimum distance between the carrier 1 and the plate 2 interfered with each other can be directly read out from a scale on the third scale mark where the rotation ring 6 finally stops.

Figure 4:
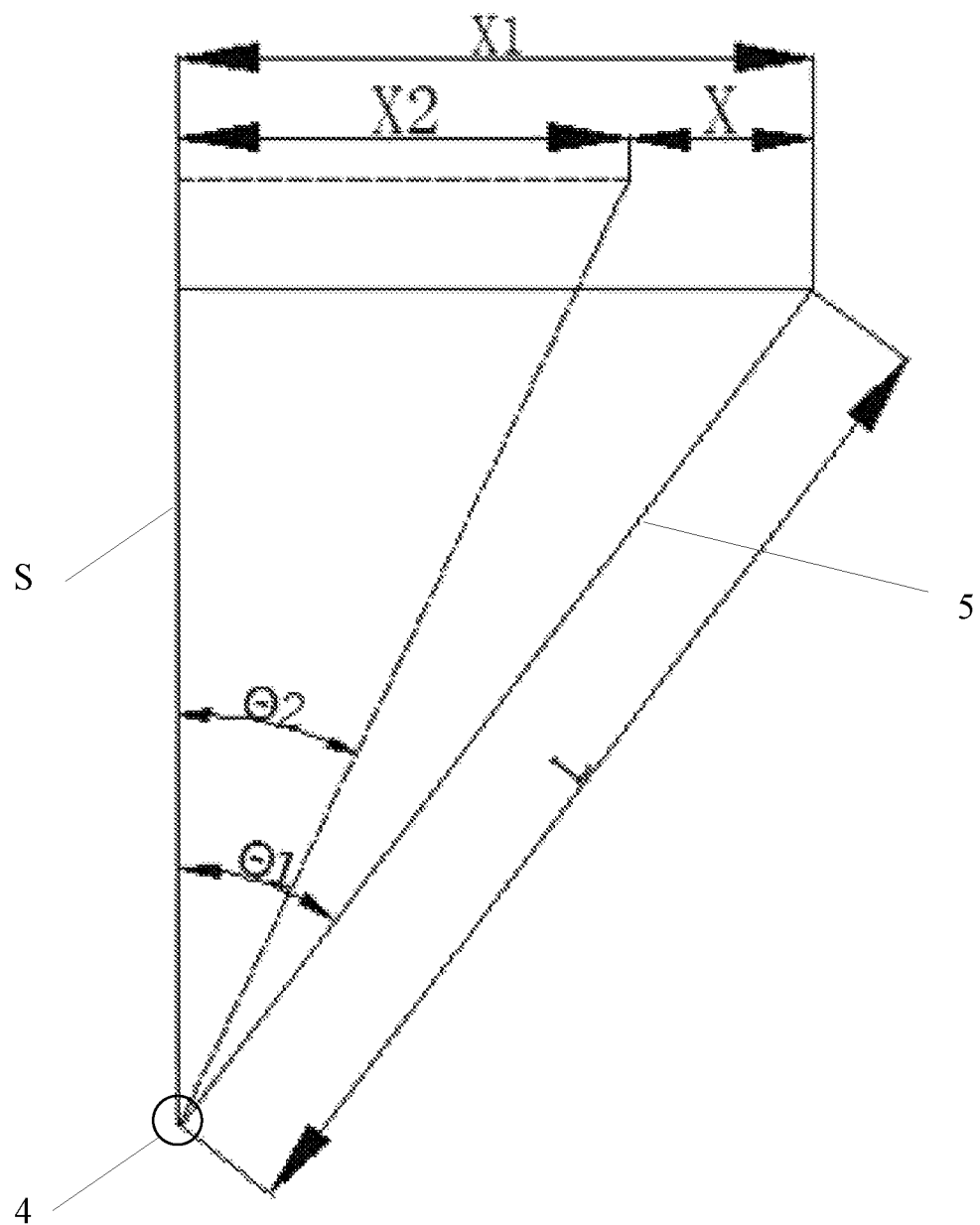
FIG. 4 is a view of calculating the distance between an carrier 1 and an plate 2 according to a rotation angle of an rotation shaft 4 when carrier 1 and plate 2 interfere with each other.

FIG. 4 shows a view of calculating the distance between the carrier 1 and the plate 2 according to a rotation angle of the rotation shaft 4 when the carrier 1 and the plate 2 interfere with each other. As shown in FIG. 4, assume that the length of the rotation arm 5 is L and an initial angle of the rotation arm 5 with respect to a surface of the carrier 1 facing the rotation arm 5 (more accurately, a surface passing through the center point of the rotation shaft 4 and parallel to the surface of the carrier 1 facing the surface of the rotation arm 5, i.e., plane S in FIG. 4) is $\theta_1$. At that point, the carrier 1 does not interfere with the plate 2, i.e., the distance between the plate 2 and the plane S is greater than $X_1=L*\sin \theta_1$. When the carrier 1 is about to come into interference with the plate 2 during movement of the carrier 1, the angle between the rotation arm 5 and the plane S is still $\theta_1$, and the distance between the plate 2 and the plane S is $X_1$. With further interference therebetween, the rotation arm 5 is in contact with the plate 2 and rotates about the rotation shaft 4 when driven by the plate 2, so that a new and smaller angle of $\theta_2$ is formed with respect to the plane S. At that point, the distance between the plate 2 and the plane S is $X_2=L*\sin \theta_2$. The distance between the plate 2 and the carrier 1 can be obtained through summing the distance $X_2$ between the plate 2 and the plane S and the distance between the center of the rotation shaft 4 of the rotation arm 5 and the carrier 1. Thus, the distance between the plate 2 and the carrier 1 corresponds to the angle between the rotation arm 5 and the plane S on a one-to-one basis, and the distance between the plate 2 and the carrier 1 can be conveniently calculated based on the angle between the rotation arm 5 and the plane S. Thus, either a series of angle values or a series of distance values corresponding to the angles can be marked on the third scale mark on the base 3. Optionally, in an exemplary embodiment of the present disclosure, in order to rotate the rotation ring 6 in a single direction along with the rotation shaft 4, a notch groove 61 is provided along the circumferential direction of the rotation ring 6. A toggle pin 41 is provided on the rotation shaft 4, wherein the toggle pin 41 is slidably inserted in the notch groove 61. When the actual distance between the carrier 1 and the plate 2 is greater than a predetermined distance, the toggle pin 41 on the rotation shaft 4 comes into contact with one end of the notch groove 61 on the rotation ring 6, and both of the toggle pin 41 and the end of the notch groove 61 that is in contact with the toggle pin 41 are located at a zero position of the third scale mark on the base 3. When the actual distance between the carrier 1 and the plate 2 is less than the predetermined distance, the rotation shaft 4 rotates under drive by the rotation arm 5, and the toggle pin 41 pushes the end of the notch groove 61 so that the rotation ring 6 rotates along with the rotation shaft 4. When the carrier 1 moves on to a place where the actual distance between the carrier 1 and the plate 2 is greater than the predetermined distance, the rotation arm 5 is released from the plane 2 and returns to its initial position. At the same time, the rotation shaft 4 rotates in a reverse direction along with the rotation arm. At that point, the toggle pin 41 on the rotation shaft 4 slides in the notch groove 61 on the rotation ring 6 in a direction going away from the end where the notch groove 61 is in contact with the toggle pin 41. Thus, the rotation ring 6 would not be driven to rotate along with the rotation shaft 4. Thereby, a single-direction rotation of the rotation ring 6 along with the rotation shaft 4 can be realized. As a result, the rotation ring 6 can stay at a maximum rotation angle of the rotation shaft 4, such that a maximum value of the rotation angle of the rotation shaft 4 can be read out conveniently.

Optionally, as shown in FIG. 3, according to an exemplary embodiment of the present disclosure, the apparatus for detecting a distance between a carrier and a plate further comprises a reset spring 7, one end of the reset spring 7 being connected to the base 3 and the other end of the reset spring 7 being connected to the rotation shaft 4. The reset spring 7 is used to return the rotation arm 5 to its initial position (for example, perpendicular to the surface of the carrier 1 facing the rotation arm 5) when the rotation arm 5 is not in contact with the plate 2. That is, the rotation arm 5 is at the initial position prior to coming into contact with the plate 2. After the rotation arm 5 contacts the plate 2 and releases from the plate 2, the reset spring 7 shrinks to reversely rotate the rotation shaft 4, thereby the rotation arm 5 automatically rotates in a reverse direction and resets to its initial position.

Optionally, as shown in FIG. 3, in an exemplary embodiment of the present disclosure, a stopper 31 is provided on the base 3 and a limiter 42 is provided on the rotation shaft 4. When the rotation arm 5 is at its initial position, the limiter 42 abuts against the stopper 31. The rotation of the rotation shaft 4 in a direction toward the stopper 31 can be restricted by abutting the limiter 42 against the stopper 31, so that the rotation shaft 4 can only rotate in a single direction away from the stopper 31 when the rotation shaft 4 leaves its initial position. As a result, the rotation arm 5 can only rotate in the single direction when it leaves the initial position as well. Thus, the accuracy of the measurement can be guaranteed. In order to make the structure simple and compact, in this embodiment, a connector 43 is provided on the rotation shaft 4, wherein one end of the reset spring 7 is connected to the stopper 31 on the base 3, and the other end of the reset spring 7 is connected to the connector 43 on the rotation shaft 4.

Optionally, as shown in FIG. 2, in an exemplary embodiment of the present disclosure, the rotation mechanism further comprises a first turntable 8 and a second turntable 9. Measurement of the contact length between the rotation arm 5 and the plate 2 can be realized through the first turntable 8 and the second turntable 9. During movement of carrier 1 relative to the plate 2, the contact length between the rotation arm 5 and the plate 2 is the distance between the carrier 1 and the plate 2 when interference occurred therebetween. Particularly, in this embodiment, a fixed shaft 51 perpendicular to the rotation arm 5 is provided on one end of the rotation arm 5 away from the base 3. The first turntable 8 is rotatably disposed around the fixed shaft 51 and is horizontally placed on the rotation arm 5. The first turntable 8 rotates by friction when it is in contact with the plate 2, and indirectly pushes the rotation arm 5 to rotate. A first scale mark (not shown) is provided on the circumference of the first turntable 8. A protrusion 81 is provided at a zero position of the first scale mark. The second turntable 9 is used to measure a number of rotations of the first turntable 8. Gear teeth 91 and a second scale mark (not shown) are provided on the circumference of the second turntable 9. The second scale mark corresponds to the gear teeth 91. A post 52 perpendicular to the rotation arm 5 is also provided on the rotation arm 5. A support shaft 53 parallel to the rotation arm 5 is provided on one side of the post 52 opposite to the base 3. The second turntable 9 is rotatably disposed around the support shaft 53 and is located over the side edge of the first turntable 8, such that the gear teeth 91 on the second turntable 9 can mate with the protrusion 81 on the first turntable 8. When the rotation arm 5 is at the initial position, the zero position of the second scale mark on the second turntable 9 overlaps the zero position of the first scale mark on the first turntable 8. When the rotation arm rotates and leaves the initial position, once the first turntable 8 rotates a circle, the protrusion 81 pushes a gear tooth 91 to rotate the second turntable 9 by one mark line. Thereby, the number of rotations that the first turntable 8 rotated can be read out based on the number of mark lines passed by the second turntable 9 through rotation. The rotation angle of the first turntable 8 in the last circle can be read out from the first scale mark on the first turntable 8, and then a rotation length of the first turntable 8 can be calculated. The contact length between the rotation arm 5 and the plate 2, i.e., a length on which interference occurred between the carrier 1 and the plate 2, is the sum of the circumference of the first turntable 8 multiplied by the number of rotations the first turntable 8 rotated and the rotation length of the first turntable 8 in the last circle. Thereby, detection of the interference distance between the carrier 1 and the plate 2 can be realized. A risk of interference can be further reduced and delivery safety can be guaranteed.

To sum up, according to the apparatus of the exemplary embodiment for detecting a distance between a carrier and a plate, the distance between the carrier 1 and the plate 2 can be calculated based on the rotation angle of the rotation mechanism, realizing accurate measurement of the distance between the carrier 1 and the plate 2. The contact length between the rotation arm 5 and the plate 2 can be calculated by means of the first turntable 8 and the second turntable 9, so that measurement of the interference distance between the carrier 1 and the plate 2 can be realized. The performance of the apparatus for detecting a distance between a carrier and a plate would not be affected or damaged by the vacuum environment, thus it can measure the distance and interference length between the carrier 1 and a shielding plate or other mechanism located around the carrier 1 in a vacuum chamber of a vacuum vapor deposition device, so as to reduce a risk of interference between the carrier 1 and the shielding plate or other mechanism and guarantee delivery safety.

It shall be noted that: the above embodiments are merely illustration of the technical solution of this disclosure, but are not limitation thereto. Although this disclosure has been described in detail with reference to the above embodiments, those ordinary skilled in the art shall understand that the technical solutions recited in the various embodiments described above may be modified or some technical features thereof may be substituted equivalently, and such modifications or substitutions do not deviate the nature of the technique from the spirit and scope of the technique embodied in the embodiments according to this disclosure.

What is claimed is:

1. An apparatus for detecting a distance between a carrier and a plate, comprising:
   a base provided on the carrier;
   a rotation mechanism rotatably provided on the base and configured to rotate when the carrier is in contact with the plate during movement of the carrier relative to the plate; and
   a rotation angle measuring mechanism configured to measure a rotation angle of the rotation mechanism, so as to obtain the distance according to the rotation angle.

2. The apparatus according to claim 1, wherein the rotation mechanism comprises a rotation shaft rotatably provided on the base, and a rotation arm for coming into contact with the plate and driving the rotation shaft to rotate, one end of the rotation arm is connected to the rotation shaft, and another end of the rotation arm points to a direction away from the base.

3. The apparatus according to claim 2, wherein the rotation angle measuring mechanism comprises a rotation ring disposed around the rotation shaft and capable of rotating in a single direction when driven by rotation of the rotation shaft, and wherein a third scale mark is provided on the base at a position corresponding to a circumference of the rotation ring.

4. The apparatus according to claim 3, wherein a notch groove is provided along a circumferential direction of the rotation ring, and wherein the rotation shaft is provided with a toggle pin which is slidably inserted into the notch groove.

5. The apparatus according to claim 2, further comprising a reset spring, wherein one end of the reset spring is connected to the base and another end of the reset spring is connected to the rotation shaft, and wherein the reset spring is configured to put the rotation arm to its initial position when the rotation arm is not in contact with the plate.

6. The apparatus according to claim 5, wherein a stopper is provided on the base, and a limiter is provided on the rotation shaft, wherein the limiter abuts against the stopper when the rotation arm is at the initial position.

7. The apparatus according to claim 2, wherein the rotation mechanism further comprises a first turntable for coming into contact with the plate and producing rotation, and a second turntable for measuring a number of rotations of the first turntable, wherein the first turntable is provided at one end of the rotation arm away from the base, and is provided with a first scale mark along its circumference, and a protrusion at a zero position of the first scale mark; gear teeth and a second scale mark corresponding to the gear teeth are provided on the circumference of the second turntable; wherein the protrusion is mate-able with the gear teeth.

8. The apparatus according to claim 7, wherein the rotation arm is provided with a fixed shaft at an end of the rotation arm away from the base, the fixed shaft is perpendicular to the rotation arm, and wherein the first turntable is rotatably disposed around the fixed shaft.

9. The apparatus according to claim 7, wherein the rotation arm is provided with a post perpendicular to the rotation arm, and a support shaft parallel to the rotation arm is provided on one side of the post opposite to the base, the second turntable being rotatably disposed around the support shaft and positioned above a side edge of the first turntable.

10. The apparatus according to claim 3, wherein the third scale mark has a series of values of distance between the carrier and the plate that correspond to the rotation angle of the rotation mechanism.

11. The apparatus according to claim 1, wherein the apparatus is in a chamber for vacuum vapor deposition, and the plate is a shielding plate.

* * * * *